United States Patent [19]

Kelley

[11] 4,414,506
[45] Nov. 8, 1983

[54] ELECTRICAL CIRCUIT TEST PROBE

[76] Inventor: Jack M. Kelley, 119 S. Wasson, Apt. 21, Coos Bay, Oreg. 97420

[21] Appl. No.: 221,520

[22] Filed: Dec. 30, 1980

[51] Int. Cl.³ ...................... G01R 27/26; H01R 29/00
[52] U.S. Cl. ............................... 324/158 P; 339/31 T
[58] Field of Search ................ 324/72.5, 65 P, 158 P; 339/31 M, 31 T, 108 TP, 261

[56] References Cited

U.S. PATENT DOCUMENTS

| 2,675,528 | 4/1954 | LaPoint | 339/108 TP X |
| 3,182,257 | 5/1965 | Linkowski | 324/72.5 X |
| 3,368,187 | 2/1968 | Faul et al. | 339/108 TP X |

OTHER PUBLICATIONS

Baxter et al, Self Holding Scope Probe, IBM Tech Discl. Bulietin, Aug. 1959, p. 9.

*Primary Examiner*—Stanley T. Krawczewicz
*Assistant Examiner*—Jose M. Solis
*Attorney, Agent, or Firm*—Berman, Aisenberg & Platt

[57] ABSTRACT

The invention disclosed herein is a test probe for testing components in electric circuits. The test probe contains a plurality of pointed needles substantially parallel and separable. There is a hook to secure an electrical component lead between the needles. The needles are biased together and held in an electrically insulated grip to enable an operator to hold the test probe and attach it to live component leads. An electrical conductor is conductively connected to both of the needles to conduct electrical signals from the component tested to a test meter.

13 Claims, 6 Drawing Figures

ELECTRICAL CIRCUIT TEST PROBE

FIELD OF THE INVENTION

The invention is a test probe apparatus for testing electrically conductive leads of electrical components in a circuit.

BACKGROUND OF THE INVENTION

Prior art in the electrical test probe art contains many examples of test probes which can be attached to the conductive leads of electrical components and circuits. These probes can be then attached to electrical meters to read out appropriate variables concerning the component operation.

A test probe which tests the electrical properties of circuit components is shown in U.S. Pat. No. 2,580,682 issued to Russell E. Kraft on Jan. 1, 1952. The Kraft probe discloses a hand held probe having a handle with an insulating sheath 22. The sheath 22 contains a V cross section rod 13 having a longitudinal groove 14 therein containing transverse notch 15 for capturing a component lead. A resilient pointed wire 16 is slidably engaged in the groove of rod 13. The probe is operated by pushing the component lead under wire 16 until it is captured by the notch 15 in rod 13. Pointed wire 16 deflects upwardly to allow the lead to be captured within notch 15 and rod 13. Rod 13 is conductively connected on its shoulder to a wire which transmits electrical signals to be monitored in a test meter.

Another test probe is disclosed in U.S. Pat. No. 4,151,462 issued to A. Lee Teyler on Apr. 24, 1979. The Teyler probe shows an insulated housing 5 containing a tip 4 conductively connected to conductor 9. A retractable boot 2 telescopically mounted over housing 5 fits over housing 5 containing tip 4. The probe end has an annular sleeve 4 with a needle to capture and retain conventional leads. Clip 3 is housed in tip 4 and has pivotable elements 15 and 16 with teeth 22 which are spring biased together to encase tip 4. Conductive leads are captured between the needle and annular sleeve 4. The signal is transmitted from sleeve 4 through a conductor 9 to be attached to a test meter.

A simplified test probe is shown in U.S. Pat. No. 3,368,187 issued to Walter J. Faul et al on Feb. 6, 1968. The test probe in Faul et al constitutes a contact clip to capture a component wire wherein the component wire is held against a loop 10 of a wire portion by hook 11. Both loop 10 and hook 11 are bent from the same piece of wire. The wire is conductively connected to an electrical conductor 24 which transmits signals to an electrical test meter. The test clip is contained in an insulating sheath c to protect the holder.

In U.S. Pat. No. 2,675,528 issued to James P. LaPoint on Apr. 13, 1954, is shown a test probe for attachment to electrical leads leading to electrical components in a circuit. The test probe has a cylindrical casing 1 having retractable needle point 6 having notch 7 therein. Retractable point 6 slides in the channel of a spring contact 8, the spring contact 8 having gripping jaws 11 with holding notches 12 located on the end of the channel shaped spring contact. The component lead wire is held in jaw 7 of retractable point 6 which is retracted into spring contact 8 where it is held in holding notches 12 of the gripping jaws. An electrical signal is then transmitted through the spring contact 11 which is connected to an insulated conductor 10 and into a test meter.

A variety of test probes have hook-like needles to grab a component lead and secure the component lead against a conductor which transmits test signals through insulated conductor wires to test meters. Examples of these test probes are seen in U.S. Pat. No. 2,516,657 issued to Max J. Spendlove on July 25, 1950; U.S. Pat. No. 3,201,746 issued to Crawford S. Askew on Aug. 17, 1965 and U.S. Pat. No. 3,821,689 issued to Cleve A. Graham on June 28, 1974.

Prior art test probes do not disclose a method wherein the test probe can be attached to a conductor lead by capturing the conductor lead between two needles. None of the prior art references disclose sharpened needles which may be used to isolate and easily capture an exposed component lead.

SUMMARY OF THE INVENTION

It is a primary object of the invention to provide a test probe which can isolate and test electric signals flowing through component leads.

It is a further object of the present invention to provide a test probe which captures the component lead between a pair of sharpened needles and secures the lead in place by use of a hook.

It is another important object of the invention to allow a technician to hold the test probe and test the signal flowing through the component lead without feeling an electrical shock.

It is still a further object of the invention to provide a test probe which isolates and attaches itself to a component lead and transmits the signal flowing through the lead through a conductor wire to a test meter which reads the values of the signals.

The above objects are accomplished by the invention which, in a preferred embodiment, is a test probe apparatus for testing electrically conductive leads comprising a plurality of pointed needles substantially parallel and separable, a means to secure an electrically conductive lead between said needles, the needles being secured in an electrically insulated handle and biased together. A means to conduct the electrical signals is conductively attached to both of said needles and transmits the electrical signal from the component lead through the needles, through the conductive lead and to an electrical testing device.

BRIEF DESCRIPTION OF THE DRAWINGS

The novel features that are considered characteristic of the invention are set forth in the appended claims. The invention itself, however, both as to its organization and mode of operation together with additional objects and advantages thereof, will best be understood from the following description of the specific embodiment when read in connection with the accompanying drawings, wherein like reference characters indicate like parts throughout the several figures, and in which:

BRIEF DESCRIPTION OF THE INVENTION

Figure 1:
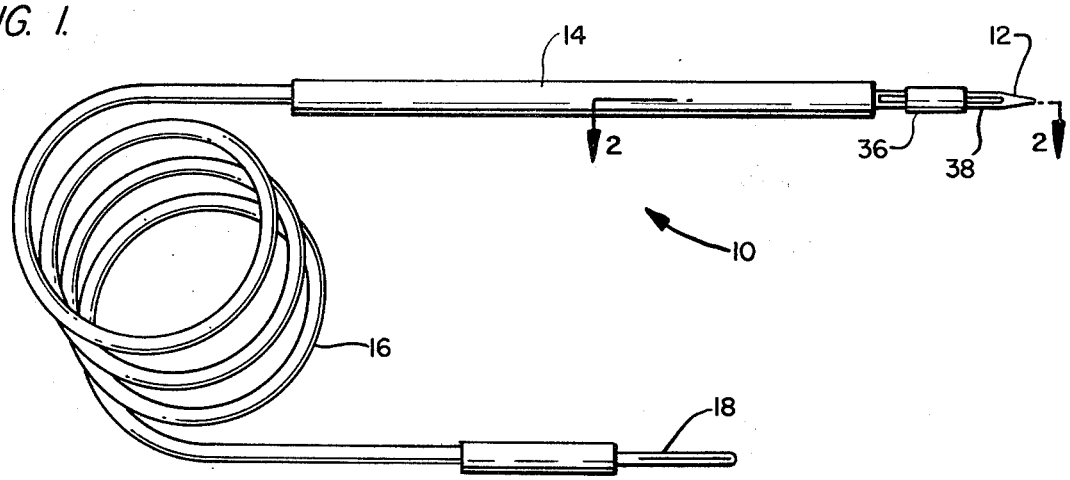
FIG. 1 is a perspective view of the electrical test probe apparatus of the current invention.

The apparatus of the present invention is shown in perspective view in FIG. 1. Test probe 10 has a functional test end 12 to conductively attach the probe to electrical component leads. Test end 12 is secured in handle 14 which is made of electrically insulating material to allow one to hold the test probe 10 while conducting the test procedure. The means to conduct electrical signals, conductor 16, is electrically connected to test end 12 on one of its ends and to a connector means 18 on the other end. Connector means 18 is accepted in the receiving receptacle of an electrical test meter. Test probe 10 transmits electrical signals from electrical component leads through to the conductor 16 to connector means 18 which is placed into a receptor of an electric test meter. The electric test meter then displays the properties of the electrical component.

Figure 2:
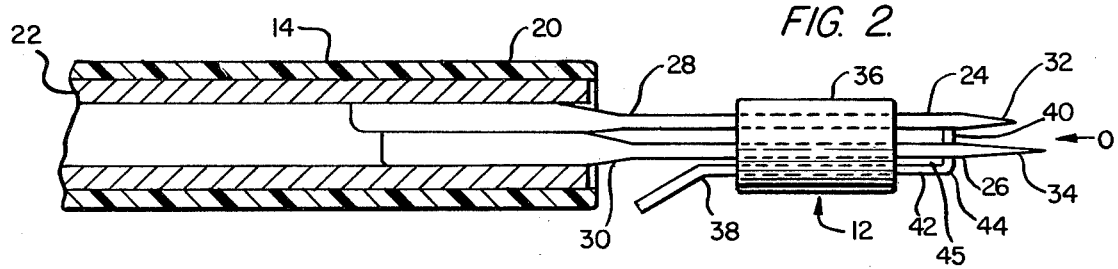
FIG. 2 is a partially cutaway view of the forward part of the apparatus which connects the test probe to the electrical component lead.
Figure 3:
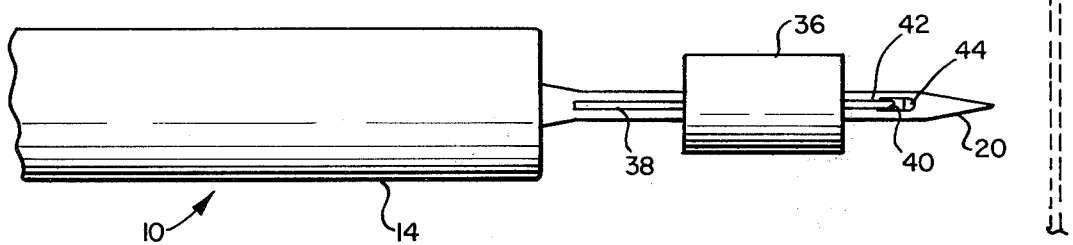
FIG. 3 is a close-up view of the test portion of the electrical test probe.

An enlarged view of the test end 12 of the test probe 10 is shown in FIG. 2. Handle 14 is seen in cross section having a cylindrical outer sheath 20 coaxially disposed about inner sheath 22, which is made of electrically conducting material. A plurality, preferably two, of electrically conductive needles 24 and 26, having thick bases 28 and 30 respectively and pointed ends 32 and 34 are biased together by sleeve 36. Sleeve 36 is made of a resilient material, preferably electrically insulating material such as rubber or synthetic polymers.

Hook 38 captures and retains an electrical component lead between the two needles 24 and 26. Hook 38 comprises a transverse end 40 connected to longitudinal section 42. As seen in phantom lines in FIGS. 2, transverse end 40 fits through an aperture 44 in needle 26 and aperture 45 in needle 24 to hook and capture the lead of an electrical component for testing between needles 24 and 26. Longitudinal section 42 is contained within a channel-like portion 45 on the outside surface of needle 26. Hook 38 is held adjacent needle 26 in channel-like portion 45 by sleeve 36. The resilience of sleeve 36 allows needles 24 and 26 to spread to accept a component lead therebetween. Hook 38 bridges the spread needles to hold the component between them once captured.

Figure 4:
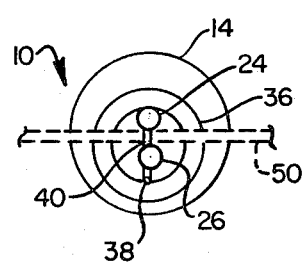
FIG. 4 is a front end view of the electrical test probe wherein needles slide over the wire.
Figure 5:
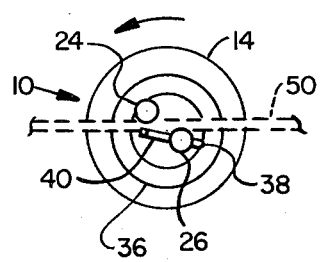
FIG. 5 is a front end view of the electrical test probe engaging an electrical lead and rotated to allow the hook to pass over the lead and thereby hooking the lead between the needles.
Figure 6:
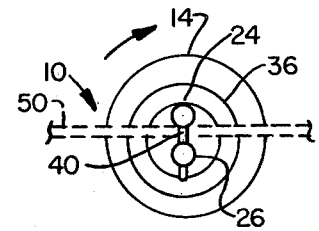
FIG. 6 is a front end view of an electrical test probe as it appears when electrically connected and mechanically attached to the component lead.

The test probe functions to capture electrical component lead for testing as shown in FIGS. 4-6. In FIG. 4, needles 24 and 26 capture electrical component wire 50 therebetween. The transverse end 40 of hook 38 is mounted perpendicularly between the needles and prevents the component lead from sliding between the two needles. The probe, with component lead 50 between needles 24 and 26, is then rotated counter clockwise as seen in FIG. 5 thereby spreading needles 24 and 26 and releasing hook transverse end 40 from aperture 45 allowing passage of component lead 50 past transverse end 40 between needle 24 and hook transverse end 40. The probe 10 is then pushed forward to move component lead 50 between needles 24 and 26 rearwards of hook transverse end 40. The probe 10 is then rotated clockwise, as seen in FIG. 6, allowing the needles 24 and 26 to return to a position with hook transverse end 40 over aperture 45. In this position, sleeve 36 biases the needles 24 and 26 together with lead 50 therebetween to insure good electrical contact between the lead and the needles. Hook transverse end 40 bridges the gap between needles 24 and 26 to prevent inadvertent disengagement of the probe from lead 50 by removal of the component lead 50 from between the needles 24 and 26 thereby breaking electrical contact prior to completion of testing.

The probe may be removed from component lead 50 after testing is complete by reversing the actions described above. The probe may be moved to another component lead for testing.

Although a certain specific embodiment of the invention has been shown and described, it is obvious that many modifications thereof are possible. It is therefore not intended to be limited to the exact showing and description thereof, but the scope of the invention is considered to include reasonable and obvious equivalents thereof.

What is claimed is:

1. An electrical test probe apparatus for testing electrically conductive leads comprising:
   a plurality of pointed needles substantially parallel and separable;
   securing means to secure an electrical component lead between said needles;
   a means to bias said needles together to grip said electrically conductive lead in electrically conductive contact; and
   a means to conduct electrical signals conductively connected to one end of one of said needles,
   wherein said means to bias said needles together is an electrically insulating sheath.

2. The test probe apparatus in claim 1 wherein securing means component is a hook.

3. The test probe apparatus in claim 2 wherein said hook has a transverse end passing through at least one aperture in one of said needles to capture said electrical lead between said needles.

4. The test probe apparatus of Claim 3 wherein there is a handle means in which said needles are contained.

5. The test probe apparatus of claim 4 wherein said means to conduct electrical signals comprises an electrical conductor wire conductively connected to said needles.

6. The test probe apparatus of claim 5 wherein said electrical conductor wire has a connector means conductively attached.

7. The test probe apparatus of claim 5 wherein said handle means is made of electrically insulating material.

8. The test probe of claim 7 wherein said connector means is adapted to be connected to an electrical test device.

9. The test probe of claim 8 wherein said hook has a longitudinal section accepted in a channel-like portion of one of said needles and is held in place by said sheath.

10. An electrical test probe apparatus for contacting electrically conductive leads comprising:
    a plurality of pointed needles extending along substantially parallel axes;
    securing means to secure an electrical component lead between said needles, said securing means extending between said needles transverse to said axes when said needles are spaced by a first predetermined distance;
    means to bias said needles together to grip said electrically conductive lead in electrically conductive contact, and to allow said needles to separate to a second distance to allow said lead to pass said securing means; and means to conduct electrical signals conductively connected to said one end of one of said needles.

11. The test probe apparatus as claimed in claim 10 wherein said means to bias said needles together is an electrically insulating sheath.

12. The test probe apparatus in claim 11 wherein said means to secure an electrical component lead between said needles is a hook which passes through at least one aperture in one of said needles.

13. The test probe of claim 12 wherein said hook has a longitudinal section accepted in a channel-like portion of one of said needles and is held in place by said sheath.

* * * * *